(12) United States Patent
Otani (10) Patent No.: US 10,585,249 B2
(45) Date of Patent: Mar. 10, 2020

(54) OPTICAL TERMINATOR, ELECTRONIC APPARATUS, OPTICAL CONNECTOR PROTECTION SYSTEM, MONITORING METHOD, AND PROGRAM

(71) Applicant: SONY CORPORATION, Tokyo (JP)

(72) Inventor: Eiji Otani, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/075,468

(22) PCT Filed: Dec. 20, 2016

(86) PCT No.: PCT/JP2016/087913
§ 371 (c)(1),
(2) Date: Aug. 3, 2018

(87) PCT Pub. No.: WO2017/138263
PCT Pub. Date: Aug. 17, 2017

(65) Prior Publication Data
US 2019/0041589 A1 Feb. 7, 2019

(30) Foreign Application Priority Data
Feb. 12, 2016 (JP) .................. 2016-024557

(51) Int. Cl.
*G02B 6/42* (2006.01)
*H01L 31/0203* (2014.01)
(Continued)

(52) U.S. Cl.
CPC ............ *G02B 6/42* (2013.01); *H01L 31/0203* (2013.01); *H01L 31/12* (2013.01); *H01L 33/54* (2013.01);
(Continued)

(58) Field of Classification Search
CPC .......... G02B 6/42; H01L 31/02; H01L 33/48; H01L 33/62; H01L 33/56; H01L 31/0203; H01L 31/12; H01L 33/54; H04B 10/07
See application file for complete search history.

(56) References Cited

U.S. PATENT DOCUMENTS 5,035,486 A * 7/1991 Inokuchi ................ G02B 3/005
359/530
5,093,879 A * 3/1992 Bregman ............. G02B 6/4249
250/227.11
(Continued)

FOREIGN PATENT DOCUMENTS

JP S55-134489 9/1980
JP S58-19660 2/1983
(Continued)

OTHER PUBLICATIONS

International Search Report prepared by the Japan Patent Office dated Mar. 13, 2017, for International Application No. PCT/JP2016/087913.

*Primary Examiner* — Ryan A Lepisto
(74) *Attorney, Agent, or Firm* — Sheridan Ross P.C.

(57) ABSTRACT

An optical terminator includes a housing, a second optical device array, and a control unit. The housing is configured to be connectable to an optical connector including a first optical device array having a plurality of light emitting devices and a plurality of light receiving devices. The second optical device array has a plurality of light emitting devices and a plurality of light receiving devices and is arranged in the housing. The control unit is arranged in the housing and is connected to the second optical device array.

9 Claims, 9 Drawing Sheets

(51) Int. Cl.
*H01L 31/12* (2006.01)
*H01L 33/56* (2010.01)
*H01L 33/62* (2010.01)
*H04B 10/07* (2013.01)
*H01L 33/54* (2010.01)

(52) U.S. Cl.
CPC .............. *H01L 33/56* (2013.01); *H01L 33/62* (2013.01); *H04B 10/07* (2013.01)

(56) References Cited

U.S. PATENT DOCUMENTS

| | | | |
|---|---|---|---|
| 8,415,696 B2 * | 4/2013 | Park | G02B 5/1876 |
| | | | 257/98 |
| 2011/0058819 A1 * | 3/2011 | Azegami | H04B 10/50 |
| | | | 398/135 |
| 2015/0043881 A1 * | 2/2015 | Suzuki | G02B 6/3866 |
| | | | 385/134 |

FOREIGN PATENT DOCUMENTS

| | | |
|---|---|---|
| JP | S62-022614 | 2/1987 |
| JP | H04-269023 | 9/1992 |
| JP | H05-040214 | 2/1993 |
| JP | H05-175887 | 7/1993 |
| JP | 2002-311349 | 10/2002 |
| JP | 2011-211565 | 10/2011 |
| JP | 2015-031911 | 2/2015 |

* cited by examiner

OPTICAL TERMINATOR, ELECTRONIC APPARATUS, OPTICAL CONNECTOR PROTECTION SYSTEM, MONITORING METHOD, AND PROGRAM

CROSS REFERENCE TO RELATED APPLICATIONS

This application is a national stage application under 35 U.S.C. 371 and claims the benefit of PCT Application No. PCT/JP2016/087913 having an international filing date of 20 Dec. 2016, which designated the United States, which PCT application claimed the benefit of Japanese Patent Application No. 2016-024557 filed 12 Feb. 2016, the entire disclosures of each of which are incorporated herein by reference.

TECHNICAL FIELD

The present technology relates to a technology of an optical terminator that is a terminator of an optical connector that transmits an optical signal and the like.

BACKGROUND ART

A protection cap of an optical connector disclosed in Patent Literature 1 includes U-shaped optical fiber molded with synthetic resin or the like so as to expose both ends of the fiber from a mold part. The protection cap is attachable and detachable to an optical connector including a light emitting device and a light receiving device arranged at a device side. Since the protection cap inhibits dust from entering the optical connector and an optical signal from a light emitting device is input to the light receiving device via the optical fiber of the protection cap, the device can be tested (for example, see Patent Literature 1, specification p. 5, line 3 to p. 6, line 1, FIG. 1).

CITATION LIST

Patent Literature

Patent Literature 1: Japanese Unexamined Utility Model Application Publication No. 62-22614

DISCLOSURE OF INVENTION

Technical Problem

In recent years, as image and sound quality of contents becomes higher, data traffic is increased. Accordingly, an interface (optical connector) capable of transmitting high capacity data is increasingly needed. At the same time, a convenient terminator mounted on the optical connector is needed.

An object of the present disclosure to provide an optical terminator having an improved convenience used in a multichannel transmission type optical connector capable of transmitting high capacity data and related technologies.

Solution to Problem

In order to achieve the above-described object, an optical terminator includes a housing, a second optical device array, and a control unit.

The housing is configured to be connectable to an optical connector including a first optical device array having a plurality of light emitting devices and a plurality of light receiving devices.

The second optical device array has a plurality of light emitting devices and a plurality light receiving devices and is arranged in the housing.

The control unit is arranged in the housing and is connected to the second optical device array.

Since the housing of the optical terminator is connected to the optical connector including the plural of light emitting devices and the plural of light receiving devices, i.e., a multichannel transmission type optical connector, it can inhibit dust from entering the optical connector. In addition, since the second optical device array and the control unit are arranged in the housing, communication by an optical transmission between the optical connector and the optical terminator is possible. Thus, optical terminator has an improved convenience.

The control unit may be configured to measure an amount of received light acquired by at least one of the plurality of light receiving devices of the second optical device array and to transmit the measured amount of received light to the first optical device array by driving at least one of the plurality of light emitting devices of the second optical device array in the state that the housing is connected to the optical connector.

Thus, an apparatus including the optical connector receives data of the amount of received light and can evaluate the status of a transmission path of the optical connector on the basis of the amount of received light.

At least one of the plurality of light emitting devices of the second optical device array may be configured to emit light with predetermined light emission intensity toward at least one of the plurality of light receiving devices of the first optical device array in the state that the housing is connected to the optical connector.

Thus, the apparatus including the optical connector can evaluate the status of a reception path of the optical connector on the basis of the amount of light received at least one light receiving device.

The optical terminator may further includes a cleaning mechanism that cleans the optical connector in the state that the housing is connected to the optical connector.

Thus, dust attached to the optical connector can be removed. Accordingly, a good light transmission status can be maintained.

The cleaning mechanism may include a vibration device.

The vibration device may include a motor, a conversion mechanism that converts rotational driving power of the motor to linear power, and a member driven by the conversion mechanism.

The optical terminator may further includes an optical member arranged at a light exit side and a light incident side of the second optical device array, a board on which the control unit is mounted, and a resin material arranged between the optical member and the board over the second optical device array.

The resin material may be silicon resin.

Thus, halogen free is available.

An electronic apparatus according to an embodiment includes an optical connector and a first control unit.

The optical connector includes a first optical device array having a plurality of light emitting devices and a plurality of light receiving devices and is configured to be connectable to the housing of the above-described optical terminator.

The first control unit is configured to cause at least one of the plurality of light emitting devices of the first optical device array to emit light by controlling driving of the first optical device array in the state that the housing is connected to the optical connector.

The first control unit is configured to measure an amount of received light in a case where at least one of the plurality of light receiving devices of the first optical device array receives the light emitted from at least one of the plurality of light emitting devices of the second optical device array in the state that the housing is connected to the optical connector.

An optical connector protection system according to an embodiment includes the above-described electronic apparatus and the above-described optical terminator.

A method of monitoring an optical connector is done by the above-described electronic apparatus.

At least one of a plurality of light emitting devices of the first optical device array emits light with predetermined light emission intensity in the state that the housing of an optical terminator is connected to the optical connector.

At least one of the plurality of light receiving devices of the first optical device array receives an amount of light data in a case where at least one of a plurality of light receiving devices of a second optical device array arranged in the housing of the optical terminator receives emitted light and in a case where at least one of the plurality of light emitting devices of the second optical device array receives the amount of light data received by the plurality of light emitting devices.

At least one of the plurality of light emitting devices of the first optical device array receives the emitted light in a case where at least one of the plurality of light emitting devices of the second optical device array emits light with predetermined light emission intensity.

The first control unit measures an amount of received light.

A program according to an embodiment is a program that causes the electronic apparatus to execute the method of monitoring an optical connector.

Advantageous Effects of Invention

As described above, the present technology can provide an optical terminator having an improved convenience and related technologies.

It should be noted that the effects described here are not necessarily limitative and may be any of effects described in the present disclosure.

MODE(S) FOR CARRYING OUT THE INVENTION

Hereinafter, embodiments of the present technology will be described with reference to the drawings.

1. Optical Connector Protection System

Figure 1:
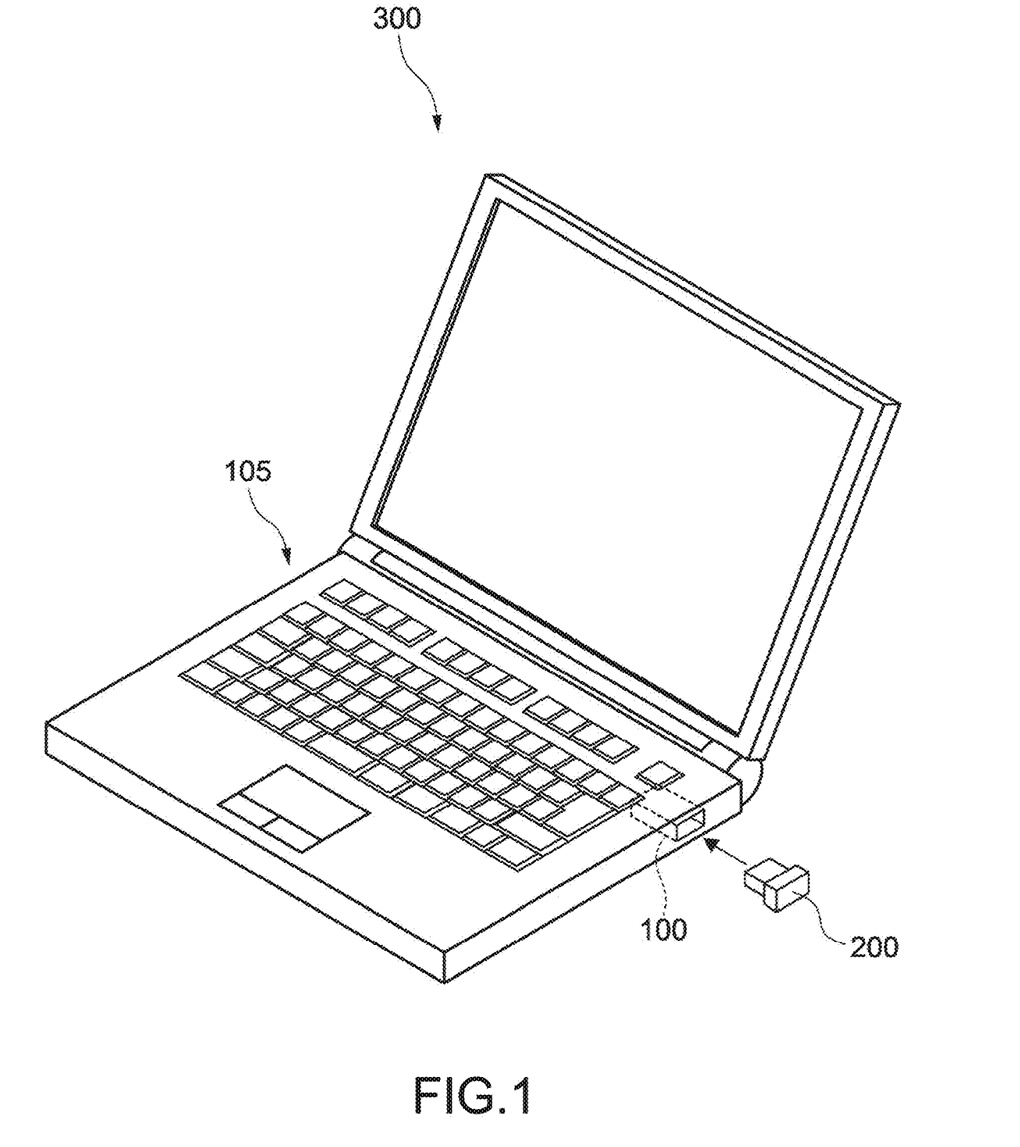
FIG. 1 shows an optical connector protection system according to an embodiment of the present technology.

FIG. 1 shows an optical connector protection system according to an embodiment of the present technology. An optical connector protection system 300 includes an electronic apparatus 105 and an optical terminator 200. The electronic apparatus 105 is typically a PC (Personal Computer) or the like. (A housing 210) of the optical terminator 200 is, for example, a cap type small-sized device and is connectable (attachable and detachable) to an optical connector 100 arranged in the electronic apparatus 105.

Figure 2:
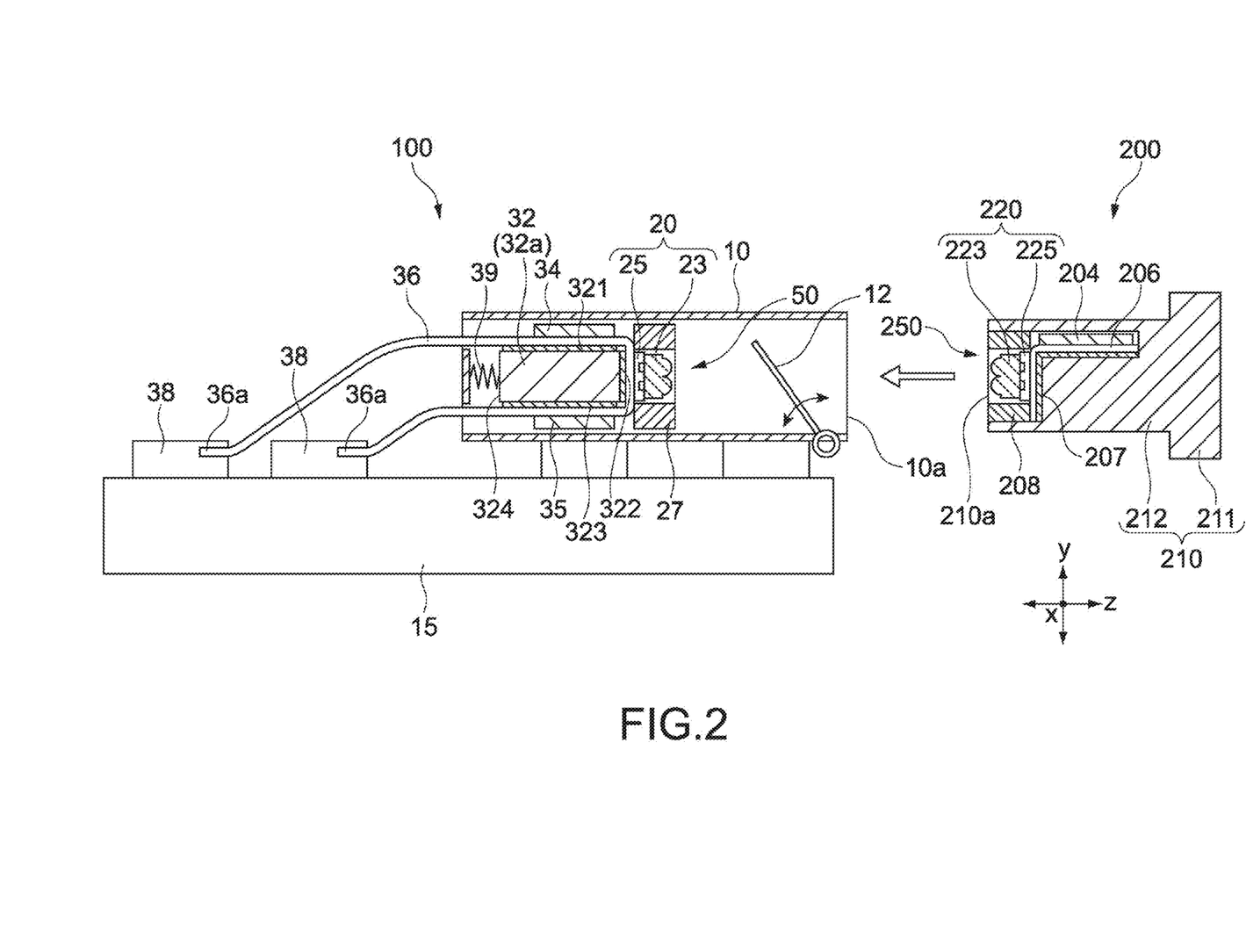
FIG. 2 is a cross-sectional view showing an optical connector and an optical terminator in an electronic apparatus according to a first embodiment.

FIG. 2 is a cross-sectional view showing the optical connector 100 and the optical terminator 200 in the electronic apparatus 105 according to a first embodiment.

2. Optical Connector

Figure 3A:
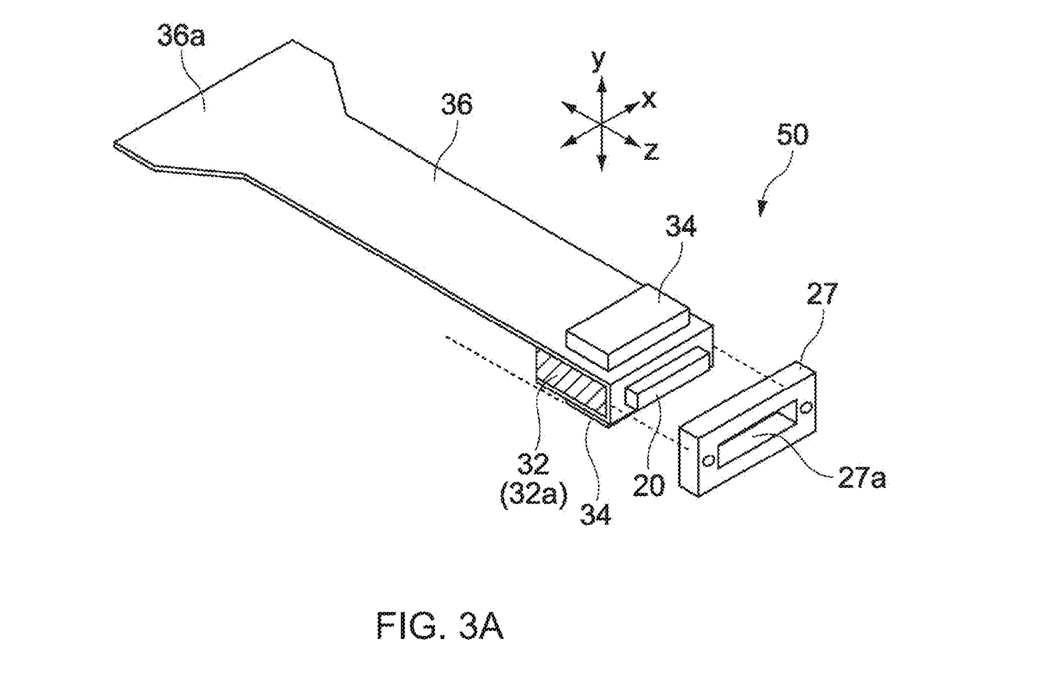
FIG. 3A is a perspective view schematically showing the internal unit of the optical connector.

As shown in FIG. 2, the optical connector 100 includes a connector housing 10 and an internal unit 50 arranged in the connector housing 10. FIG. 3A is a perspective view schematically showing the internal unit 50.

The connector housing 10 has a structure that a part of the housing 210 of the optical terminator 200 can be inserted and fit into the connector housing 10. As the fitting structure, a variety of structures including a protrusion or groove engagement structure and a locking structure with a flat spring may be used.

An opening 10a is arranged at a front side of the connector housing 10 and is covered with a shutter 12. The shutter 12 has a structure that closes the opening 10a by using spring force (not shown). In a case where the optical terminator 200 is connected to the optical connector 100, the housing 210 resists to the spring force of the shutter 12, pushes down the shutter 12, and is inserted into the housing 10.

In this specification, an axis direction that the optical terminator 200 is inserted into and removed from the optical connector 100 (left and right directions of FIG. 2) is denoted by the z axis, and two axes perpendicular to the z axis are denoted as the x and y axes for convenience of description.

The internal unit 50 includes a core block 32, an optical device array unit 20, control ICs 34, and a guard member 27.

The core block 32 has a region 32a having a plurality of faces and a substantial rectangular parallelepiped shape, for example. The core block 32 has a top face 321, a front face 322, a bottom face 323, and a rear face 324 opposite to the front face 322.

A desirable material of the core block. 32 has high thermal conductivity such as a metal material in order to provide a heat dissipation function. Examples of the metal material include aluminum, copper, and the like. A heat dissipation structure such as a heat dissipation fin may be arranged at the rear face 324 of the core block 32.

A flexible wiring board 36 is arranged on the core block 32 by folding over along the top face 321, the front face 322, and the bottom face 323. Specifically, guide plates 17 are respectively attached to the top face 321, the front face 322, and the bottom face 323 of the core block 32, and the flexible board 36 is adhered to the guide plates 17.

The optical device array unit 20 has an optical device array (first optical device array) 25 and a lens member 23 arranged at the front thereof. The optical device array 25 is mounted on the flexible wiring board 36 at the front face 322 of the core block 32.

The control ICs 34 are respectively mounted on (the flexible wiring board 36 at) the top face 321 of the core block 32 and the bottom face 323. The control ICs 34 drive light emitting devices 25a (described later) of the optical device array 25 and process a signal of received light by light receiving devices 25b. One control IC 34 may be used.

Figure 4A:
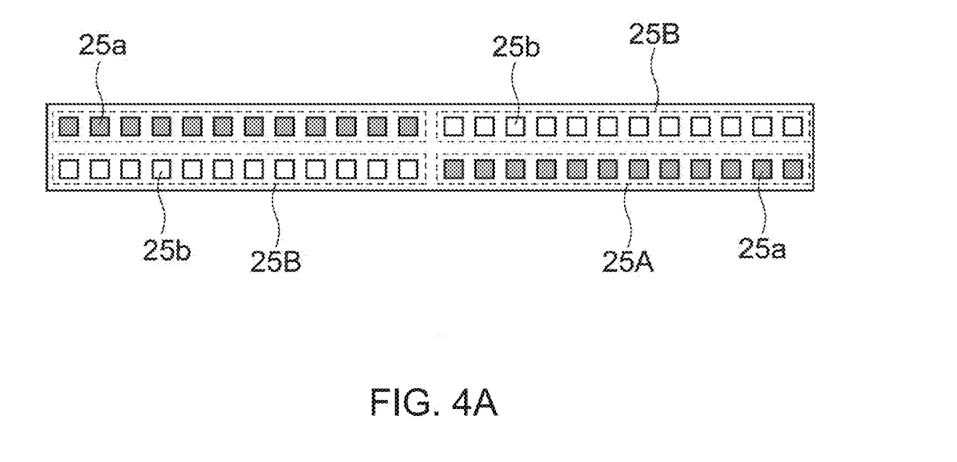
FIG. 4A shows the optical device array viewed from a front face (from the z direction).

FIG. 4A shows the optical device array 25 viewed from the front face (from the z direction). The optical device array 25 includes a plurality of light emitting devices 25a and a plurality of light receiving devices 25b and these devices are two-dimensionally arranged on a chip. Specifically, the optical device array unit 20 is a multichannel transmission type unit. In other words, there are multichannel transmission (transmission by light emitting devices 25a) and multichannel reception (reception by light receiving devices 25b). In this embodiment, 12 transmission channels and 12 reception channels are respectively arranged.

For example, the optical device array 25 includes two light emitting device groups 25A and 25A and two light receiving device groups 25B and 25B. The light emitting device groups 25A and 25A and the light receiving device groups 25B and 25B are rotationally symmetrically arranged around the z axis.

Figure 4B:
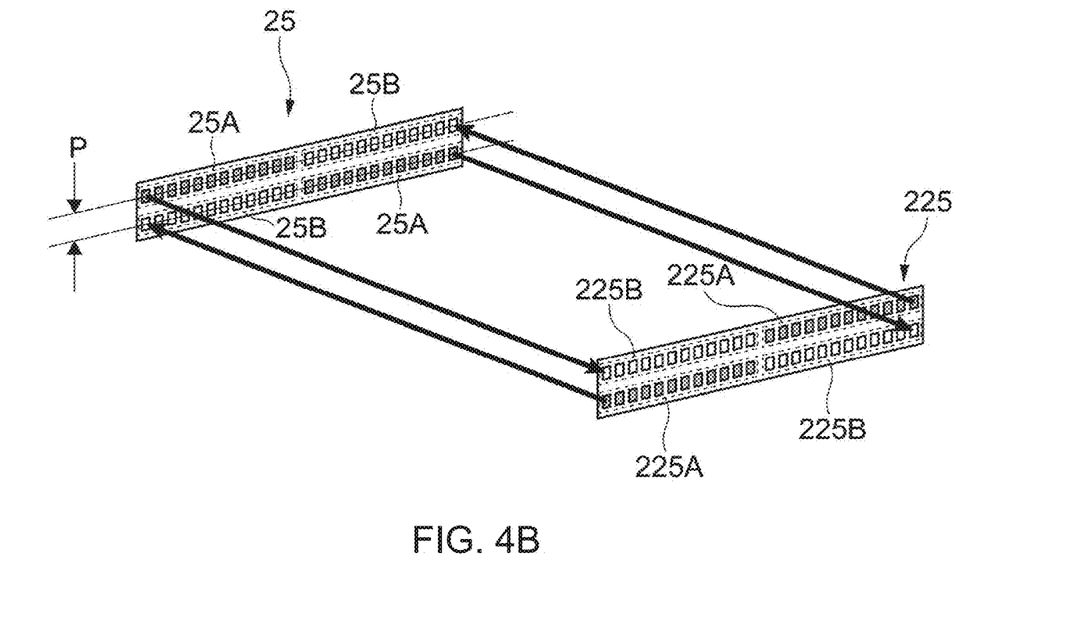
FIG. 4B is a schematic view showing correspondence between the optical device array of the optical connector and an optical device array of the optical terminator.

FIG. 4B is a schematic view of correspondence between the optical device array 25 of the optical connector 100 and an optical device array 225 of the optical terminator 200. The optical device array (second optical device array) 225 arranged in the optical terminator 200 also has substantially the same structure as that of the optical device array 25 of the optical connector 100. The optical device array 25 and the optical device array 225 are faced in the state that the optical terminator 200 is connected to the optical connector 100. The light emitting device groups 25A and 25A and the light receiving device groups 25B and 25B are rotationally symmetrically arranged and light emitting device groups 225A and 225A and light receiving device groups 225B and 225B of the optical device array 225 are rotationally symmetrically arranged. Thus, a reversible connection between the optical connector 100 and the optical terminator 200 is possible.

Typically, the light emitting device is a semiconductor light emitting device, for example, an LED (Light Emitting Diode) or an LD (Laser Diode). The light receiving element is, for example, a PD (Photo Diode).

Note that a pitch P between the light emitting device 25a and the light receiving device 25b of the optical device array 25 is, for example, 200 μm to 400 μm, typically 250 μm. The same applies to the optical device array 225.

The lens member 23 of the optical device array unit 20 has a function to convert the light coupled between the optical connector 100 and the optical terminator 200 into parallel light.

As shown in FIG. 2, the optical connector 100 is arranged on a print board 15. Connector components 38 are mounted on the printed board 15 at the rear of the housing 10. Terminals 36a of the flexible wiring board 36 are drawn outside the connector housing 10 and are connected to the connector components 38.

Figure 3B:
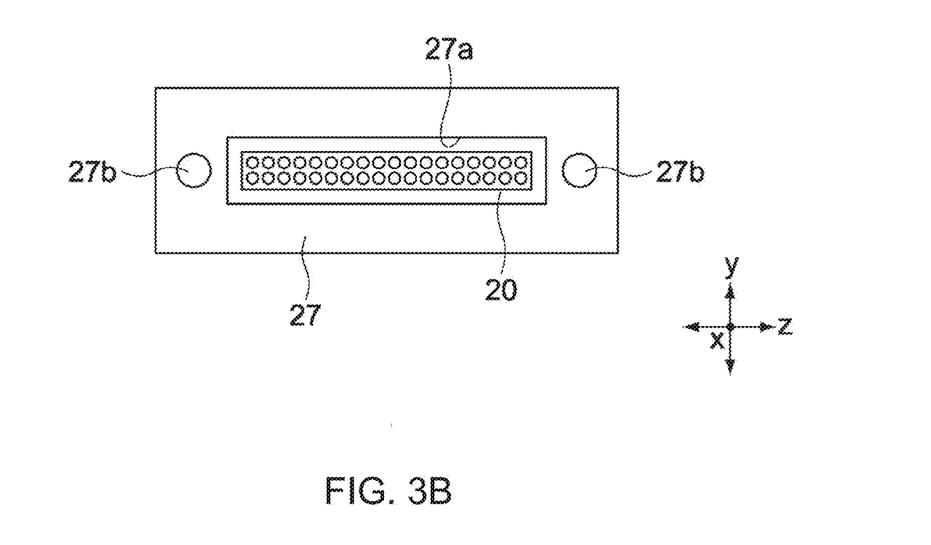
FIG. 3B shows a guard member and an optical device array unit viewed from a front face 322 (from the z direction).

As shown in FIG. 3A, the guard member 27 having an opening 27a is arranged at the front face 322 of the core block 32. FIG. 2B shows the guard member 27 and the optical device array unit 20 viewed from the front face 322 (from the z direction). The guard member 27 is attached to the front face 322 of the core block 32 such that the optical device array unit 20 faces forward via the opening 27a.

In a case where the optical terminator 200 is connected to the optical connector 100, the guard member 27 has a function to protect the optical device array unit 20 from colliding with the housing 210 and an optical device array unit 220.

As shown in FIG. 3B, positioning structures 27b are arranged at both ends of the front face 322 of the guard member 27 in the longitudinal direction (x direction). The positioning structures 27b are, for example, holes or pins. By engaging with pins or holes arranged in a guard member 208 (see FIG. 2) of the optical terminator 200, the optical receptacle module 100 and the optical terminator 200 are positioned mainly in the x-y plane.

As shown in FIG. 2, an elastic member 39 is arranged between the rear face 324 of the core block 32 and the rear face 324 of the connector housing 10. The elastic member 39 is a coil spring but may be instead a flat spring. The elastic member 39 positions the internal unit 50 to the connector housing 10 in the z direction in a free state with no elastic force, for example. Alternatively, by arranging a stopper (not shown) that limits a forward movement (right direction of FIG. 2) of the internal unit 50 in the connector housing 10, the internal unit 50 may be positioned in the z direction in a state that the elastic member 39 has some elastic force. In a case where the optical terminator 200 is connected to the optical connector 100, the housing 210 comes in contact with the guard member 27 while pressing the internal unit 50 against the elastic force of the elastic member 39.

Note that the elastic member 39 may not be present. In this case, a stopper (not shown) that limits forward and backward movements of the core block 32 along the z axis may be arranged in the housing 10.

3. Optical Terminator

As shown in FIG. 2, the optical terminator 200 includes the housing 210 having an opening 210a at the front face and the internal unit 250 arranged in the housing 210. The housing 210 includes a body 212 and a flange 211 arranged at the end. The shape of the housing 210 is not limited thereto and may have any shape as long as the body 212 has the shape capable of fitting into the connector housing 10 of the optical connector 100.

The internal unit 250 includes a flexible wiring board 206 arranged in an L-shaped cross section on a guide plate 207, a control IC 204 mounted on a top face of the flexible wiring board 206, and the optical device array unit 220 mounted on a front face of the flexible wiring board 206.

The optical device array unit 220 has the similar structure as that of the optical device array unit 220 of the optical connector 100 described above. Specifically, the optical device array unit 220 includes the optical device array (second optical device array) 225 mounted on the flexible wiring board 206, a lens member (optical member) 223 mounted on the front face of the optical device array 225, and a guard member 208 surrounding the optical device array 225 and the lens member 223.

4. Electrical Structure of Optical Connector Protection System

Figure 5:
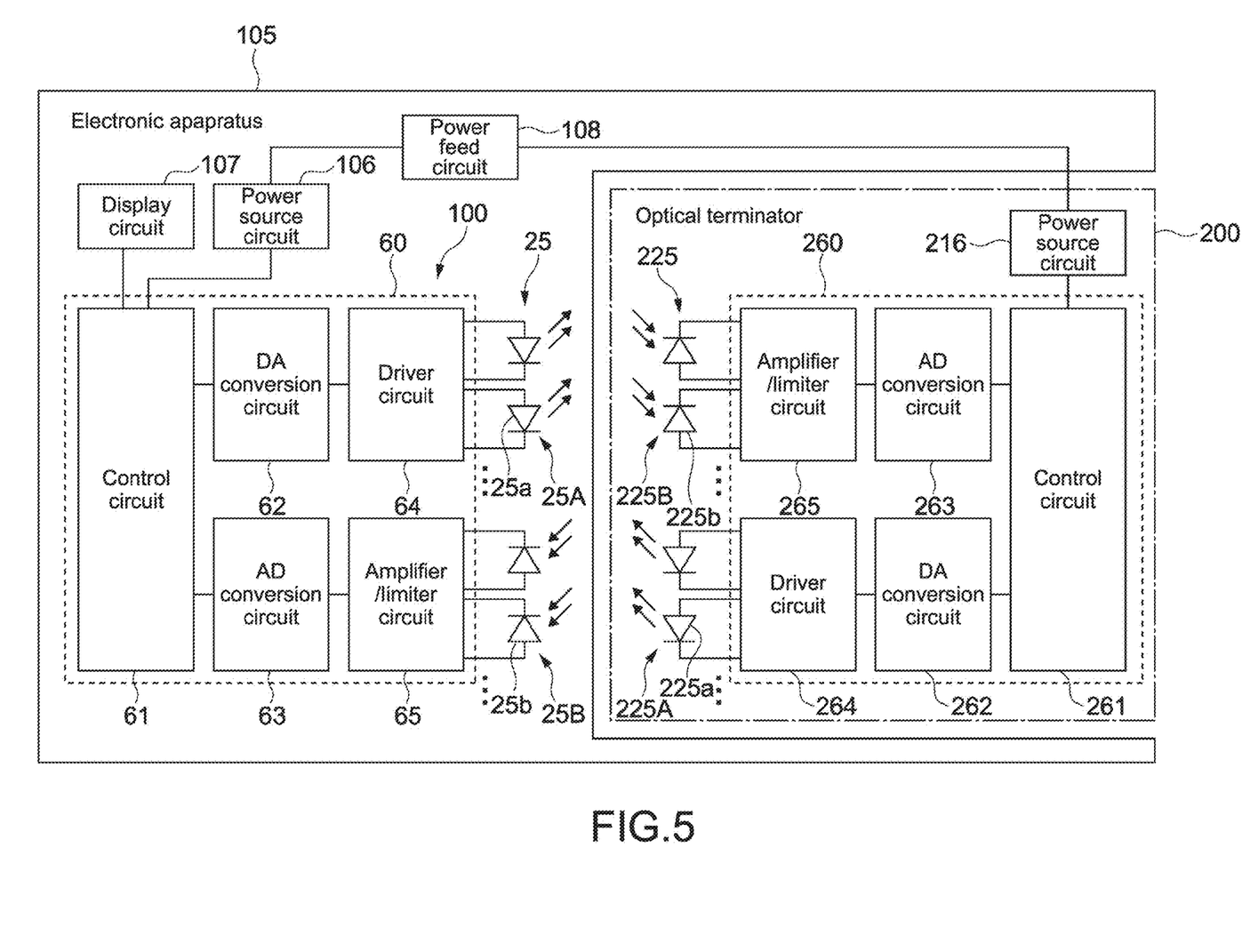
FIG. 5 is a block diagram showing an electrical structure of the optical connector protection system.

FIG. 5 is a block diagram showing an electrical structure of the optical connector protection system 300. The electronic apparatus 105 includes the optical connector 100 and also includes a display circuit 107, a power source circuit 106, a power feed circuit 108, and the like.

The optical connector 100 includes a control unit (first control unit) 60 connected to the optical device array 25. The control unit 60 includes a control circuit 61, a DA conversion circuit 62, an AD conversion circuit 63, a driver circuit 64, and an amplifier/limiter circuit 65. The control unit 60 includes one or more above-mentioned control ICs 34 (see FIG. 2). Alternatively, a part or whole of the control circuit 61 may include a CPU of the electronic apparatus 105 arranged outside the optical connector 100.

The power feed circuit 108 has a function to feed electricity generated using the power source circuit 106 to a power source circuit 216 (described later) of the optical terminator 200.

The driver circuit 64 has a function to drive the light emitting devices 25a. The amplifier/limiter circuit 65 has a function to amplify the received light of the light receiving devices 25b and limit the output signal to a constant amplitude.

The control circuit 61 has a function to read and execute a necessary program from a storage (not shown) arranged in the control circuit 61 or outside the control circuit 61, for example.

A control unit (second control unit) 260 of the optical terminator 200 has a structure similar to that of the control unit 60 of the optical connector 100. Specifically, the control unit 260 of the optical terminator 200 includes a control circuit 261, a DA conversion circuit 262, an AD conversion circuit 263, a driver circuit 264, and an amplifier/limiter circuit 265. The control unit 260 includes the above-described control IC 204 (see FIG. 2).

In addition, the optical terminator 200 includes a power source circuit 216 that feeds electricity to the control circuit 261. The power source circuit 216 may be incorporated into the control IC 204, for example, or may be arranged separately in the housing 210.

Electrically contacting terminals (not shown) are arranged outside of the connector housing 10 of the optical connector 100 and outside of the housing 210 of the optical terminator 200. These terminals are respectively connected to the power source circuit 106 (power feed circuit 108) and the power source circuit 216. In a case where the housing 210 is mounted on the connector housing 10 of the optical connector 100, there terminals are in contact each other.

5. Operation of Optical Connector Protection System

Figure 6:
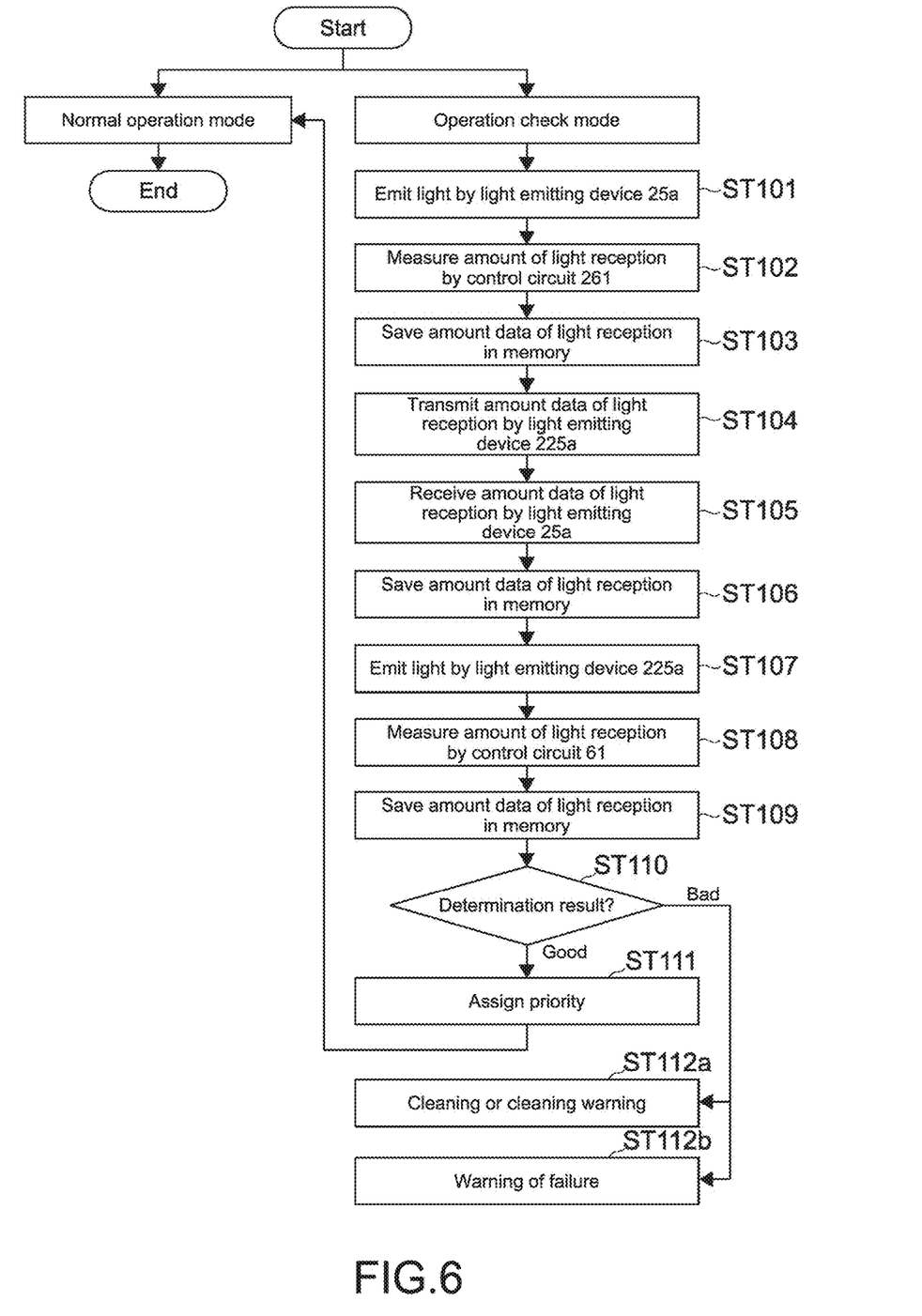
FIG. 6 is a flowchart of an operation of the optical connector protection system.

FIG. 6 is a flowchart showing processing using the control circuit 61 of the electronic apparatus 105 and the control circuit 261 of the optical terminator 200 as an operation of the optical connector protection system 300.

The control circuit 61 of the electronic apparatus 105 has two modes of operation, i.e., a normal operation mode and an operation check mode. The normal operation mode is for transmitting data using apparatuses (not shown) of the optical connector 100.

For example, when a user connects the optical terminator 200 to the optical connector 100 and the control circuit 61 receives a user's instruction to use the optical terminator 200, the operation check mode is started. The operation check mode is a method of monitoring a transmission status of the optical device arrays 25 and 225. The operation check mode is not started every time the optical connector 100 is used but is started according to the set time or the user's instruction.

When the operation check mode is started, an operation check of the light emitting device 25a at an optical connector 100 side and a transmission path is firstly performed, for example. The control circuit 61 causes the light emitting device 25a of the optical device array 25 to emit light with predetermined light emission intensity, e.g., at a predetermined DC level (Step 101).

The light receiving device 225b of the optical terminator 200 receives the light and the control circuit 261 measures the amount of received light (Step 102) and saves the amount of received light in a memory (Step 103). The amount of received thus corresponds to an amount of light emission of the light emitting device 25a. The control circuit 261 also executes Steps 101 to 103 on other channels (typically to all channels).

The control circuit 261 of the optical terminator 200 transmits the amount of received light for each channel saved in the memory to the optical connector 100 as an optical signal by using the light emitting device 225a (Step 104). In Step 104, the control circuit 261 serially transmits data typically by using one light emitting device 225a but may transmit in parallel data by using the plurality of light emitting devices 225a.

The corresponding light receiving device 25b (in a case of transmission in parallel, the plurality of light receiving devices 25b) of the optical connector 100 receive(s) the optical signal corresponding to the data of the transmitted amount of received light (Step 105). The control circuit 61 saves the data of the amount of received light (Step 106).

The control circuit 261 of the optical terminator 200 causes the light emitting device 225a to emit light with predetermined light emission intensity, e.g., at a predetermined DC level (Step 107). The light receiving device 25b of the optical connector 100 receives the light and control circuit 61 measures the amount of received light (Step 108) and saves the amount of received light in the memory (Step 109). The control circuit 261 also executes Steps 107 to 109 on other channels (typically to all channels).

The control circuit 61 evaluates and determines the transmission status on the basis of the data saved in Steps 106 and 109 (Step 110). As the evaluation method, the following method may be used. For example, the control circuit 61 uses threshold determination. The control circuit 61 determines "good" in a case where the measured amount of received light exceeds the threshold and determines "bad" in a case where the amount is the threshold value or less. As a matter of course, the control circuit 61 executes the determination for each channel.

In Step 110, the control circuit 61 assigns the order of priority of use of each channel in a case where the determination result by the above-described evaluation is "good" (Step 111). For example, in a case where a plurality of channels are evaluated, the control circuit 61 assigns the order of use on the basis of the data of the amount of received light such that the channel having a higher amount of received light is preferentially used.

The scene of using all channels is only limited, e.g., large-capacity video data in the next generation is transmitted. Accordingly, it is possible to use the channel having a low amount of received light as little as possible.

Note that in a case where the determination result is "good" in Step 110, the control circuit 61 may not execute Step 111 and proceed to the normal operation mode.

In a case where the determination result is "bad" in Step 110 or the determination result of at least one of the plurality of channels is "bad", the control circuit 61 proceed to the next Steps 112a and b. In this case, the control circuit 61 executes processing including executing a cleaning operation (cleaning) (or warning to encourage the user to clean) (Step 112a) or warning a failure to the user through the display circuit (Step 112b).

Thus, it is possible to present an adequate timing to clean the transmission path to the user and to encourage the cleaning. Alternatively, it is possible to present the failure of the optical connector 100 to the user and to encourage an adequate repair.

The cleaning may be done by the user or by a cleaning mechanism arranged at the electronic apparatus 105 or the optical terminator 200. The cleaning mechanism includes a vibration device of removing dust, for example, by vibration. The cleaning mechanism may be arranged at the electronic apparatus 105 or at the optical terminator 200. The cleaning mechanism arranged at the optical terminator 200 will be described later.

With the above-described monitoring processing, it is possible to handle a failure such as an unexpected failure, dust attachment to the optical connector 100, and degradation of the optical device array 25 over time.

As to the electrical connector capable of electrical connection in the prior art, even if dust enters into the connector, electrodes come in mechanically contact with each other when the connector is plugged or unplugged. Therefore, dust is not a particular problem. Dissimilar to this, since no mechanical contact occurs in paths of the optical connector 100, entering dust to the optical connector 100 has a significant impact on the transmission status or transmission properties.

The optical terminator 200 according to this embodiment has a function as a protection cap that inhibits dust from entering the optical connector 100. In addition, even if dust enters, the optical terminator 200 determines the transmission status of the optical signal and cleans as necessary. Thus, according to this embodiment, it is possible to maintain a good transmission status.

Furthermore, the apparatus described in Patent Literature 1 cannot determine whether or not the light emitting device is abnormal or the connector abnormal when abnormality occurs in the connector. In contrast, according to this embodiment, the amount of light emission of the light emitting device 25a (amount of received light by light receiving device 225b of the optical device array 225) is measured in Step 102 and the amount of received light of the light receiving device 25b is measured in Step 108. As a result, the control circuit 61 can distinguish both operation statuses of the light emitting device 25a and the light receiving device 25b of the optical device array 25. Note that, in this case, needless to say, it is a precondition that the optical device array of the optical terminator 200 has no abnormality.

Note that an operation speed of the optical connector 100 is in the order of GHz. In comparison therewith, the operation of the optical terminator 200 is possible in a DC operation or low-speed communication. Accordingly, difficulties in designing the circuit and the transmission path are low and the optical terminator 200 can be provided at low costs.

As described above, according to this embodiment, the optical terminator 200 having improved convenience and the optical connector protection system 300 including the optical terminator 200 can be provided.

6. Cleaning Mechanism

Figure 7:
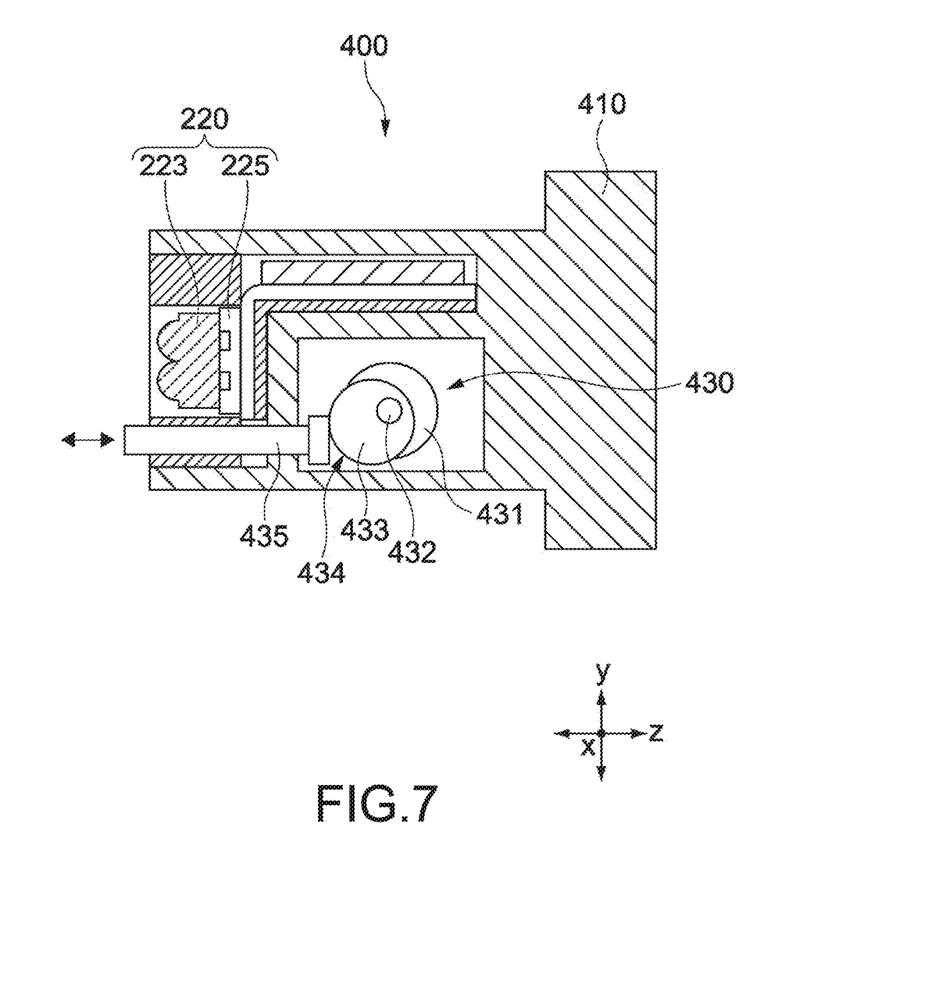
FIG. 7 is a schematic cross-sectional view showing an optical terminator further including a cleaning mechanism.

Next, an illustrative cleaning mechanism of executing the cleaning operation will be described FIG. 7 is a schematic cross-sectional view showing an optical terminator further including a cleaning mechanism 430. The optical terminator 400 includes the components substantially similar to those of the above-described optical terminator 200 except for the cleaning mechanism 430.

The cleaning mechanism 430 is arranged in the housing 410. The cleaning mechanism 430 includes, for example, a motor 431, a conversion mechanism 434 that converts rotational driving power of the motor 431 into linear power, and a pusher pin 435 as a member driven by the conversion mechanism 434. Specifically, these components form the vibration device.

The conversion mechanism 434 includes an eccentric cam 433 attached to an output axis 432 of the motor 431. A rotational motion of the eccentric cam 433 is converted into a linear motion of the pusher pin 435 in the longitudinal direction. A tip of the pusher pin 435 comes in contact with the guard member of the optical connector 100 and the pusher pin 435 is driven to vibrate the guard member.

As described above, since the optical terminator 400 includes the cleaning mechanism 430, the optical terminator 400 can remove dust of the optical connector 100 depending on the instruction from an electronic apparatus 105 side.

As the conversion mechanism of the vibration device, a crank mechanism may be used instead of the eccentric cam 433.

The vibration device is not limited to the above-described embodiments and may be a voice coil motor or a piezoelectric device.

7. Example of Optical Device Array Unit of Optical Terminator

Figure 8A:
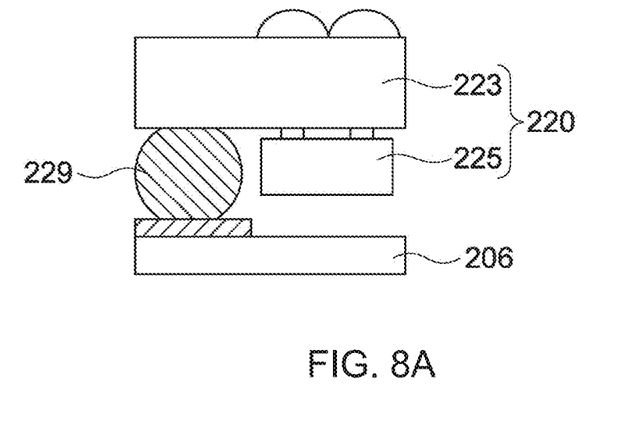
FIGS. 8A to C are cross-sectional views showing specific structural examples of the optical device array unit arranged in the optical terminator.
Figure 8B:
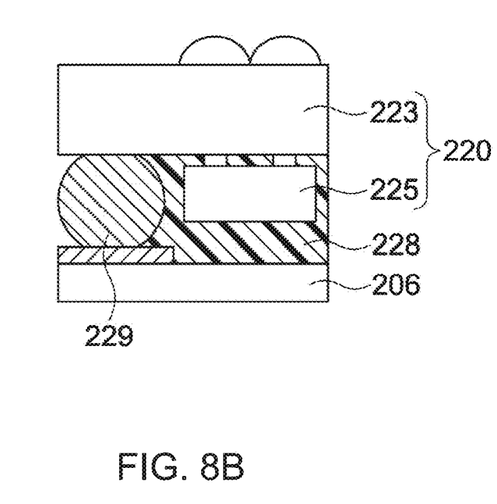
Figure 8C:
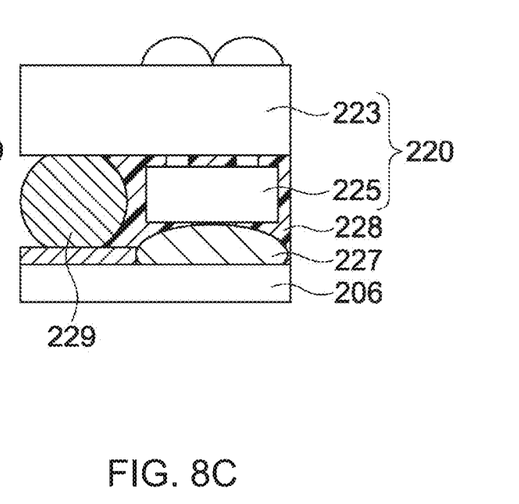

FIGS. 8A to C are cross-sectional views showing specific structural examples of the optical device array unit 220 arranged in the optical terminator 200. These cross-sectional views are viewed from the z direction of FIG. 2, etc.

As shown in FIG. 8A, the optical device array unit 220 is mounted on the flexible wiring board 206 via a connection 229 such as a solder ball and a copper core ball. A member shown by a sign 223 is the lens member (optical member) and a member shown by a sign 225 is the optical device array (second optical device array).

According to this embodiment, as shown in FIG. 8B, a resin material 228 is filled between the lens member 223 and the flexible wiring board 206 over the optical device array 225. The resin material 228 may be resin such as epoxy but is desirably silicon resin for halogen free. By arranging the resin material 228, heat dissipation properties are improved. Also, by arranging the resin material 228, the position of the optical device array unit 220 (optical device array 225) toward the flexible wiring board 206 is stabilized.

In the optical device array unit 220 according to an embodiment shown in FIG. 8C, reflowed solder paste 227 is arranged as a pillar other than the resin material 228 similar to that of FIG. 8B. The solder paste 227 is arranged between the flexible wiring board 206 and the optical device array 225. By arranging the solder paste 227 having thermal conductivity higher than that of the resin near the optical device array 225, heat dissipation properties are improved.

8. Optical Terminator According to Another Embodiment

Figure 9:
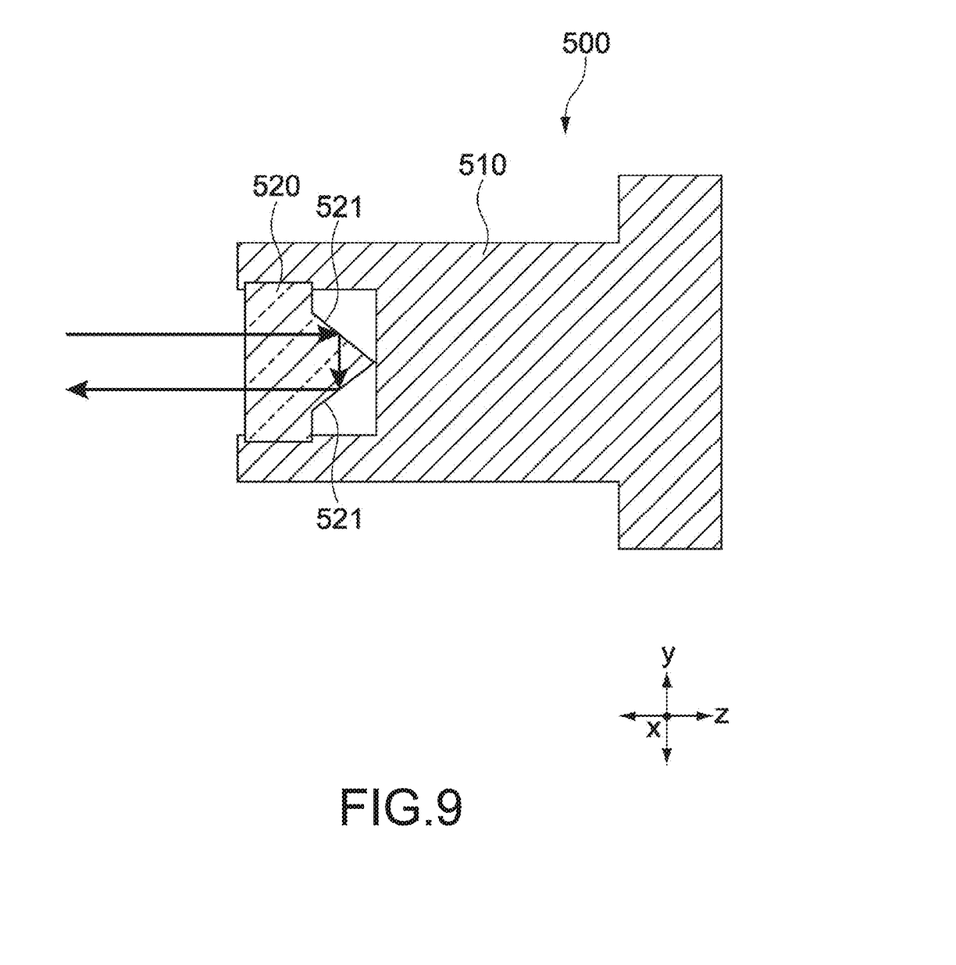
FIG. 9 is a cross-sectional view showing an optical terminator according to another embodiment.

FIG. 9 is a cross-sectional view showing an optical terminator according to another embodiment. An optical terminator 500 includes a housing 510 and a lens 520 arranged in the housing 510 that returns light emitted from the respective light emitting devices 25a of the optical connector 100 (see FIG. 2) and guides the light to the respective light receiving devices 25b of the optical connector 100. The lens 520 has two reflecting surfaces 521 disposed at an angle of 45 degrees to the z axis, for example. Thus, the light from the light emitting devices 25a totally reflects on the reflecting surfaces 521 and returns to light receiving devices 25b.

As described above, the pitch P between the light emitting device 25a and the light receiving device 25b is 200 μm to 400 μm, typically 250 μm, and is very narrow and small-sized. It is difficult to form a loop for returning the light optical fibers, for example. In addition, according to this embodiment, the light output from the optical device array 25 is made into parallel light by the lens member 23 (not diffusion light). Thus, according to this embodiment, by using the lens 520 having the two reflection surfaces 521, the optical terminator 500 having a return optical path with a simple structure can be provided.

9. Other Various Embodiments

The present technology is not limited to the above-described embodiments and other various embodiments are possible.

In the processing shown in FIG. 6, the electronic apparatus 105 monitors (evaluates) the optical connector 100. In addition, the optical terminator 200 may monitor (evaluate) the own optical device array 225 similar to the processing executed by the electronic apparatus 105. In this case, the control circuit 261 of the optical terminator 200 executes the program of monitoring. After that, the optical terminator 200 may transmit the data of the evaluation result to the electronic apparatus 105.

Alternatively, the electronic apparatus 105 may monitor (evaluate) the optical device array of the optical terminator 200 in a similar manner.

In the processing showing in FIG. 6, the threshold value used in the threshold determination in Step 110 may have two or more grades. For example, suppose the control circuit 261 has three threshold values. In a case where the measured amount of received light exceeds the highest first threshold, the control circuit 261 determines it as a first status. In a case where the measured amount of received light is between the first threshold and the next higher second threshold, the control circuit 261 determines it as a second status. In a case where the measured amount of received light is between the second threshold and the next higher third threshold, the control circuit 261 determines it as a third status. For example, a good status, a caution status, and a warning (for example, a failure status) are assigned to the first to third statuses, respectively.

Alternatively, in a case where the evaluation processing shown in FIG. 6 is second or later processing, the evaluation result may be compared to the former evaluation result.

In FIG. 5, the order of the processing from Steps 101 to 106 and the processing from Steps 107 to 108 may be reversed.

The illustrative electronic apparatus 105 on which the optical connector 100 is mounted is the PC in the above-described embodiments. Instead of this, examples may include a camera, a projector, a smartphone, a tablet, a server computer, a TV, a game machine, a recording machine, a robot, and the like.

It is possible to combine at least two features of the respective embodiments described above.

The present technology may also have the following structures.

(1) An optical terminator, including:
a housing configured to be connectable to an optical connector including a first optical device array having a plurality of light emitting devices and a plurality of light receiving devices;
a second optical device array having a plural of light emitting devices and a plurality of light receiving devices arranged in the housing; and
a control unit arranged in the housing and connected to the second optical device array.

(2) The optical terminator according to (1) above, in which the control unit is configured to measure an amount of received light acquired by at least one of the plurality of light receiving devices of the second optical device array and to transmit the measured amount of received light to the first optical device array by driving at least one of the plurality of light emitting devices of the second optical device array in the state that the housing is connected to the optical connector.

(3) The optical terminator according to (1) or (2) above, in which
at least one of the plurality of light emitting devices of the second optical device array is configured to emit light with predetermined light emission intensity toward at least one of the plurality of light receiving devices of the first optical device array in the state that the housing is connected to the optical connector.

(4) The optical terminator according to any one of (1) to (3) above, further including:
a cleaning mechanism that cleans the optical connector in the state that the housing is connected to the optical connector.

(5) The optical terminator according to (4) above, in which the cleaning mechanism includes a vibration device.

(6) The optical terminator according to (5) above, in which the vibration device includes
a motor,
a conversion mechanism that converts rotational driving power of the motor to linear power, and
a member driven by the conversion mechanism.

(7) The optical terminator according to any one of (1) to (6) above, further including:
an optical member arranged at a light exit side and a light incident side of the second optical device array;
a board on which the control unit is mounted; and
a resin material arranged between the optical member and the board over the second optical device array.

(8) The optical terminator according to (7) above, in which the resin material is silicon resin.

(9) An electronic apparatus, including an optical connector and a first control unit, in which
the optical connector includes a first optical device array having a plurality of light emitting devices and a plurality of light receiving devices and is configured to be connectable to a housing of an optical terminator that includes the housing, a second optical device array having a plurality of light emitting devices and a plurality of light receiving devices arranged in the housing, and a second control unit arranged in the housing and connected to the second optical device array,
the first control unit is configured to cause at least one of the plurality of light emitting devices of the first optical device array to emit light by controlling driving of the first optical device array in the state that the housing is connected to the optical connector, and
the first control unit is configured to measure an amount of received light in a case where at least one of the plurality of light receiving devices of the first optical device array receives the light emitted from at least one of the plurality of light emitting devices of the second optical device array in the state that the housing is connected to the optical connector.

(10) An optical connector protection system, including an electronic apparatus and an optical terminator, in which
the electronic apparatus includes
an optical connector including a first optical device array having a plurality of light emitting devices and a plurality of light receiving devices, and
a first control unit connected to the first optical device array, and
the optical terminator includes
a housing configured to be connectable to the optical connector,
a second optical device array having a plurality of light emitting devices and a plurality of light receiving devices arranged in the housing, and
a control unit arranged in the housing and connected to the second optical device array.

(11) A method of monitoring an optical connector by an electronic apparatus including the optical connector and a first control unit, including:
causing at least one of a plurality of light emitting devices of the first optical device array to emit light with predetermined light emission intensity in the state that the housing of an optical terminator is connected to the optical connector;
receiving an amount of light data by at least one of the plurality of light receiving devices of the first optical device array in a case where at least one of a plurality of light receiving devices of a second optical device array arranged in the housing of the optical terminator receives emitted light and in a case where at least one of the plurality of light emitting devices of the second optical device array receives the amount of light data received by the plurality of light emitting devices;
receiving the emitted light by at least one of the plurality of light emitting devices of the first optical device array in a case where at least one of the plurality of light emitting devices of the second optical device array emits light with predetermined light emission intensity; and
measuring an amount of received light by the first control unit.

(12) A program executable by an electronic apparatus including an optical connector and a first control unit, the program causing the electronic apparatus to execute steps of:
causing at least one of a plurality of light emitting devices of the first optical device array is emit light with predetermined light emission intensity in the state that the housing of an optical terminator is connected to the optical connector;
receiving an amount of light data by at least one of the plurality of light receiving devices of the first optical device array in a case where at least one of a plurality of light receiving devices of a second optical device array arranged in the housing of the optical terminator receives emitted light and in a case where at least one of the plurality of light emitting devices of the second optical device array receives the amount of light data received by the plurality of light emitting devices;
receiving the emitted light by at least one of the plurality of light emitting devices of the first optical device array in a case where at least one of the plurality of light emitting devices of the second optical device array emits light with predetermined light emission intensity; and
measuring an amount of received light the first control unit.

REFERENCE SIGNS LIST 20, 220 optical device array unit
23, 223 lens member
25A, 225A light emitting device group
25B, 225B light receiving device group
25a, 225a light emitting device
25b, 225b light receiving device
25, 225 optical device array
60 control unit (first control unit)
100 optical connector
105 electronic apparatus
200, 400, 500 optical terminator
204 control IC
210, 510 housing
228 resin material
260 control unit (second control unit)
300 optical connector protection system
430 cleaning mechanism
431 motor
434 conversion mechanism
435 pusher pin

What is claimed is:
1. An optical terminator, comprising:
a housing configured to be connectable to an optical connector including a first optical device array having a plurality of light emitting devices and a plurality of light receiving devices;
a second optical device array having a plurality of light emitting devices and a plurality of light receiving devices arranged in the housing;
a lens with two reflective surfaces arranged in the housing;
a control unit arranged in the housing and connected to the second optical device array;
an optical member arranged at a light exit side and a light incident side of the second optical device array;
a board on which the control unit is mounted; and
a resin material arranged between the optical member and the board over the second optical device array.

2. The optical terminator according to claim 1, wherein the control unit is configured to measure an amount of received light acquired by at least one of the plurality of light receiving devices of the second optical device array and to transmit the measured amount of received light to the first optical device array by driving at least one of the plurality of light emitting devices of the second optical device array in the state that the housing is connected to the optical connector.

3. The optical terminator according to claim 1, wherein at least one of the plurality of light emitting devices of the second optical device array is configured to emit light with predetermined light emission intensity toward at least one of the plurality of light receiving devices of the first optical device array in the state that the housing is connected to the optical connector.

4. The optical terminator according to claim 1, further comprising:
a cleaning mechanism that cleans the optical connector in the state that the housing is connected to the optical connector.

5. The optical terminator according to claim 4, wherein the cleaning mechanism includes a vibration device.

6. The optical terminator according to claim 5, wherein the vibration device includes:
a motor,
a conversion mechanism that converts rotational driving power of the motor to linear power, and
a member driven by the conversion mechanism.

7. The optical terminator according to claim 1, wherein the resin material is silicon resin.

8. An electronic apparatus, comprising an optical connector and a first control unit, wherein
the optical connector includes a first optical device array having a plurality of light emitting devices and a plurality of light receiving devices and is configured to be connectable to a housing of an optical terminator that includes the housing, a second optical device array having a plurality of light emitting devices and a plurality of light receiving devices arranged in the housing, a lens with two reflective surfaces arranged in the housing, and a second control unit arranged in the housing and connected to the second optical device array, the first control unit is configured to cause at least one of the plurality of light emitting devices of the first optical device array to emit light by controlling driving of the first optical device array in the state that the housing is connected to the optical connector, the first control unit is configured to measure an amount of received light in a case where at least one of the plurality of light receiving devices of the first optical device array receives the light emitted from the at least one of the plurality of light emitting devices of the second optical device array in the state that the housing is connected to the optical connector;

an optical member arranged at a light exit side and a light incident side of the second optical device array;

a board on which the control unit is mounted; and a resin material arranged between the optical member and the board over the second optical device array.

9. An optical connector protection system, comprising an electronic apparatus and an optical terminator, wherein
the electronic apparatus includes:
an optical connector including a first optical device array having a plurality of light emitting devices and a plurality of light receiving devices, and
a first control unit connected to the first optical device array, and the optical terminator includes:
a housing configured to be connectable to the optical connector,
a second optical device array having a plurality of light emitting devices and a plurality of light receiving devices arranged in the housing,
a lens with two reflective surfaces arranged in the housing, a control unit arranged in the housing and connected to the second optical device array;

an optical member arranged at a light exit side and a light incident side of the second optical device array;

a board on which the control unit is mounted; and a resin material arranged between the optical member and the board over the second optical device array.

* * * * *